(12) United States Patent
Yorita

(10) Patent No.: US 10,305,491 B2
(45) Date of Patent: May 28, 2019

(54) OSCILLATOR

(71) Applicant: NIHON DEMPA KOGYO CO., LTD., Tokyo (JP)

(72) Inventor: Tomoya Yorita, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 57 days.

(21) Appl. No.: 15/576,848

(22) PCT Filed: May 13, 2016

(86) PCT No.: PCT/JP2016/064261
§ 371 (c)(1),
(2) Date: Nov. 27, 2017

(87) PCT Pub. No.: WO2016/190130
PCT Pub. Date: Dec. 1, 2016

(65) Prior Publication Data
US 2018/0167072 A1 Jun. 14, 2018

(30) Foreign Application Priority Data
May 28, 2015 (JP) .................................. 2015-108729

(51) Int. Cl.
*H03B 5/04* (2006.01)
*H03B 5/32* (2006.01)
(Continued)

(52) U.S. Cl.
CPC ................ *H03L 1/04* (2013.01); *H03B 5/04* (2013.01); *H03B 5/32* (2013.01); *H03H 9/205* (2013.01);
(Continued)

(58) Field of Classification Search
CPC ... H03B 5/04; H03B 5/32; H03H 9/15; H03H 9/17; H03H 9/19; H03H 9/205;
(Continued)

(56) References Cited

U.S. PATENT DOCUMENTS 6,147,565 A * 11/2000 Satoh .................... H03B 5/32
219/210
7,821,346 B2 * 10/2010 McCracken ............ H03L 1/028
310/315

(Continued)

FOREIGN PATENT DOCUMENTS

JP   2010016759   1/2010
JP   2013051676   3/2013

(Continued)

OTHER PUBLICATIONS

"International Search Report (Form PCT/ISA/210) of PCT/JP2016/064261", dated Aug. 2, 2016, with English translation thereof, pp. 1-4.

Primary Examiner — Levi Gannon
(74) Attorney, Agent, or Firm — JCIPRNET

(57) ABSTRACT

To provide an oscillator configured to output a frequency signal accurately reflecting a result of a temperature adjustment by a heater circuit. An oscillator outputs a frequency signal with a frequency preliminarily set. A crystal resonator connected to an oscillator circuit is housed inside a crystal resonator cover. Soldering this crystal resonator cover onto the base plate inside the container disposes the crystal resonator on the base plate inside the container. A heater circuit performs a temperature adjustment inside the container based on a temperature detected by a temperature detector. At this time, the crystal resonator cover that houses the crystal resonator is constituted of a phosphorus deoxidized copper.

5 Claims, 8 Drawing Sheets

(51) Int. Cl.
*H03H 9/205* (2006.01)
*H03L 1/04* (2006.01)
*H03L 5/00* (2006.01)
*H03L 1/02* (2006.01)

(52) U.S. Cl.
CPC .............. *H03L 1/026* (2013.01); *H03L 1/028* (2013.01); *H03L 5/00* (2013.01)

(58) Field of Classification Search
CPC .......... H03H 9/21; H03H 9/215; H03L 1/026; H03L 1/028; H03L 1/04
USPC ........................ 331/66, 68–70, 154, 158, 176
See application file for complete search history.

(56) References Cited

U.S. PATENT DOCUMENTS

2009/0212878 A1* 8/2009 Arai ........................ H03B 5/04
331/158
2014/0159821 A1* 6/2014 Yorita ....................... H03L 7/06
331/16

FOREIGN PATENT DOCUMENTS

| JP | 2013051677 | 3/2013 |
| JP | 2014090391 | 5/2014 |
| WO | 2009008457 | 1/2009 |

* cited by examiner

OSCILLATOR

CROSS-REFERENCE TO RELATED APPLICATION

This application is a 371 application of the international PCT application serial no. PCT/JP2016/064261, filed on May 13, 2016, which claims the priority benefits of Japan application no. 2015-108729, filed on May 28, 2015. The entirety of each of the abovementioned patent applications is hereby incorporated by reference herein and made a part of this specification.

TECHNICAL FIELD

The present invention relates to an oscillator that detects a temperature of an atmosphere where a crystal resonator is placed to stabilize a frequency on based on the temperature detection result.

BACKGROUND ART

As an OCXO (Oven Controlled Xtal Oscillator) that is an oscillator, there is known a configuration that includes two crystal resonators and a heater (a heater circuit) adjacent to these crystal resonators as disclosed in, for example, Patent Document 1. In this OCXO, a temperature of an atmosphere where the crystal resonators are placed is detected by using a frequency difference between the two crystal resonators. Based on the temperature detection result, a supplied electricity to the heater disposed adjacent to the crystal resonators is controlled. Thus, the temperature of the crystal resonators is maintained in a constant range, thereby stabilizing the frequency of the OCXO with respect to the ambient temperature change.

Thus, the OCXO is to achieve a stability of the frequency by maintaining the temperature of the crystal resonator in the constant range. Especially, the OCXO having the above-described configuration performs a further accurate temperature detection by using the frequency difference between the two crystal resonators, thereby achieving a frequency adjustment with high accuracy.

However, when the OCXO having the above-described configuration was actually manufactured, there has been a case where the frequency of the frequency signal that was output from the OCXO was varied exceeding a range of theoretical frequency variation corresponding to a temperature adjustment range of the heater circuit.

Here, in Patent Document 2, there is disclosed an example in which a cap (crystal resonator cover) that airtightly seals a tuning-fork type crystal resonator is constituted of nickel silver (Cu—Ni—Zn based alloy) or phosphor bronze. However, the configuration of the present invention is not disclosed. These materials have a relatively low heat conductivity. Therefore, these materials are not preferred as the material for the crystal resonator cover of the crystal resonator that stabilizes the temperature using the heater circuit.

CITATION LIST

Patent Document

Patent Document 1: Japanese Unexamined Patent Application Publication No. 2013-51676: paragraph 0044, FIG. 1
Patent Document 2: Japanese Unexamined Patent Application Publication No. 2010-16759: paragraphs 0024 to 0025, FIG. 1

SUMMARY

Problems to be Solved

The present invention has been made under such circumstances, and an object of the present invention is to provide an oscillator that is configured to output a frequency signal accurately reflecting a result of a temperature adjustment by a heater circuit.

Solutions to the Problems

An oscillator according to the present invention includes a crystal resonator disposed on a base plate inside a container and outputs a frequency signal with a frequency preliminarily set. The oscillator includes a crystal resonator cover, an oscillator circuit, a temperature detector, and a heater circuit. The crystal resonator cover houses the crystal resonator and is secured to the base plate by soldering. The oscillator circuit is connected to the crystal resonator. The temperature detector detects a temperature inside the container. The heater circuit increases or decreases an output based on the temperature detected by the temperature detector to adjust the temperature inside the container. The crystal resonator cover is constituted of a phosphorus deoxidized copper.

The above-described oscillator may include the following features.

(a) The crystal resonator cover is soldered onto the base plate at a temperature in a temperature range of 220° C. to 270° C.

(b) The heater circuit is installed on the base plate.

(c) The oscillator includes a voltage control oscillating unit that includes a crystal resonator for a signal generation to output a frequency signal with a frequency corresponding to a control voltage. The voltage control oscillating unit constitutes a PLL circuit. The crystal resonator is a reference crystal resonator to obtain a reference frequency signal whose phase is compared with a phase of the frequency signal obtained from the voltage control oscillating unit. The crystal resonator for the signal generation is housed in a crystal resonator cover constituted of a metal having an annealing temperature lower than that of the phosphorus deoxidized copper. The crystal resonator cover with the low annealing temperature is secured to the base plate by soldering.

(d) The oscillator includes a second crystal resonator that is different from a first crystal resonator when assuming that the crystal resonator is the first crystal resonator. The temperature detector detects a temperature inside the container based on a value corresponding to a frequency difference between an oscillation frequency of the first crystal resonator and an oscillation frequency of the second crystal resonator. The second crystal resonator is housed in a crystal resonator cover constituted of a metal having an annealing temperature lower than that of the phosphorus deoxidized copper. The crystal resonator cover with the low annealing temperature is secured to the base plate by soldering.

Effects of the Invention

With the present invention, as a crystal resonator cover of a crystal resonator disposed in an oscillator including a heater circuit, phosphorus deoxidized copper that has a high heat conductivity and a high annealing temperature is used. As a result, while keeping a state in which a temperature control of the crystal resonator by the heater circuit is easily performed, softening of a crystal resonator cover caused when soldering to a base plate is performed is suppressed, thereby ensuring a lowered effect that, for example, a generation of a distortion in association with the softening has on a frequency variation of a frequency signal.

BRIEF DESCRIPTION OF THE DRAWINGS

FIG. 4A and FIG. 0.4B are a longitudinal sectional side view and a transverse plan view of a crystal resonator and a crystal resonator cover disposed on the base plate, respectively.

DESCRIPTION OF EMBODIMENTS

Figure 1:
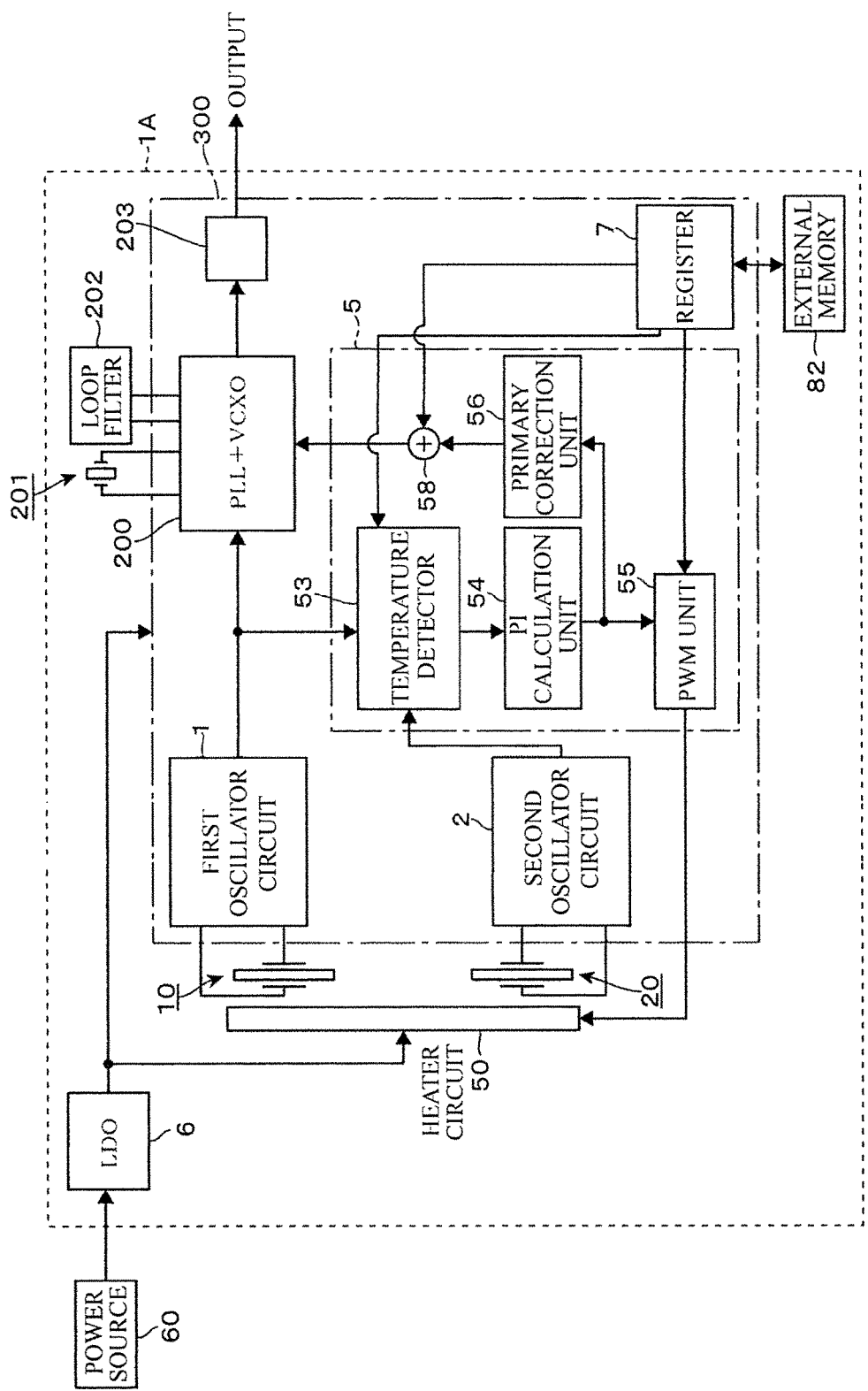
FIG. 1 is a block diagram illustrating an oscillator according to an embodiment.

FIG. 1 is a block diagram illustrating a whole oscillator 1A according to an embodiment of the present invention.

The oscillator 1A includes a first crystal resonator 10 and a second crystal resonator 20, and a first oscillator circuit 1 and a second oscillator circuit 2 that oscillate these crystal resonators. The first oscillator circuit 1 and the second oscillator circuit 2 are constituted of, for example, a Colpitts oscillation circuit.

A latter part side of the first oscillator circuit 1 and the second oscillator circuit 2 includes a DSP (Digital Signal Processor) block 5, a PLL (Phase Locked Loop) circuit unit 200, a register 7, and a frequency divider 203 that are connected to the latter part side of the first oscillator circuit 1 and the second oscillator circuit 2. The DSP block 5 includes a temperature detector 53, a PI calculation unit 54, a primary correction unit 56, and a PWM (Pulse Width Modulation) unit 55. Furthermore, adjacent to the first crystal resonator 10 and the second crystal resonator 20, a heater circuit 50 is disposed.

Here, the first oscillator circuit 1, the second oscillator circuit 2, the DSP block 5, the PLL circuit unit 200, the register 7, and the frequency divider 203, which are described above, are formed, for example, within one integrated circuit unit (LSI) 300.

The oscillator 1A includes an external memory 82. The external memory 82 stores various kinds of parameters to operate the oscillator 1A. The parameters stored in the external memory 82 are read by the register 7 in the LSI 300 and read out to blocks that use the parameters via this register 7.

In the following description, a frequency signal obtained by the first oscillator circuit 1 oscillating the first crystal resonator 10 is f1, and a frequency signal obtained by the second oscillator circuit 2 oscillating the second crystal resonator 20 is f2.

The frequency signal f1 from the first oscillator circuit 1 is used for obtaining a reference frequency signal whose phase is compared with a phase of a frequency signal obtained from a VCXO (Voltage Controlled Xtal Oscillator, voltage control oscillating unit), which will be described later, disposed within the PLL circuit unit 200. Furthermore, the frequency signal f1 is also used for a purpose of detecting a temperature (a temperature inside a container 41 described below) of an atmosphere where the crystal resonators 10 and 20 are placed. Meanwhile, the frequency signal f2 from the second oscillator circuit 2 is used only for a purpose of detecting a temperature of an atmosphere where the crystal resonators 10 and 20 are placed.

First, a description will be given of a temperature detecting method using the frequency signals f1 and C. The frequency signal f1 from the first oscillator circuit 1 and the frequency signal f2 from the second oscillator circuit 2 are input to the temperature detector 53, and $\Delta F$ is calculated. $\Delta F$ is a value corresponds to f1-f2. $\Delta F$ is a value that has a proportional relation with the temperature of the atmosphere where the crystal resonators 10 and 20 are placed, and $\Delta F$ corresponds to a temperature detection value.

Furthermore, in an exit side of the temperature detector 53, an addition unit (not illustrated) is disposed. A difference value, between a value that corresponds to a temperature setting value of the crystal resonators 10 and 20 read out from the external memory 82 and stored in the register 7 (hereinafter referred to as "the temperature setting value") and a temperature detection value $\Delta F$ calculated in the temperature detector 53, is output to the PI calculation unit 54 in the latter part. FIG. 1 illustrates a state where the temperature setting value inside the register 7 is input to the temperature detector 53 for the sake of convenience of omitting the illustration of the addition unit.

The PI calculation unit 54 integrates the difference value between the temperature setting value and the temperature detection value $\Delta F$, so as to output a PI calculation value that is a control signal for adjusting an output of the heater circuit 50 to the PWM unit 55 in the latter part. This PI calculation value is also used as a correction value of a frequency setting value when the reference frequency signal described above is obtained inside the PLL circuit unit 200.

The PWM unit 55 is to convert a digital value output from the PI calculation unit 54 into an analog signal. In the register 7 described above, a duty ratio read out from the external memory 82 is preliminarily stored. The operation of the PWM unit 55 is controlled based on this duty ratio. Instead of the PWM unit 55, a D/A (digital/analog) converter may be used.

The heater circuit 50 is disposed adjacent to the crystal resonators 10 and 20, and an output of the heater circuit 50 is adjusted by using an output of the PWM unit 55 as a control signal. The heater circuit 50 includes a power transistor. An electric power supplied from a power source 60 is supplied to a collector of this power transistor. Then, the control signal is supplied to a base of the power transistor, and by increasing and decreasing a current flowing between the collector and an emitter, an output (heat generation amount) of the heater circuit 50 can be increased and decreased.

And, the electric power supplied from the power source 60 is also supplied to the above-described LSI 300 and the like. This electric power is stabilized by a voltage stabilizer circuit 6 that is constituted of, for example, a LDO (low-voltage dropout regulator).

Next, a description will be given of the PLL circuit unit 200 that outputs a frequency signal with a stable frequency even when an ambient temperature is changed by using the frequency signal f1 obtained from the first oscillator circuit 1. As described above, the PLL circuit unit 200 is constituted within the LSI 300. The PLL circuit unit 200 includes a DDS (Direct Digital Synthesizer) circuit unit, a phase comparison unit, a charge pump unit, and an oscillator circuit of the VCXO, which are not illustrated. Furthermore, the PLL circuit unit 200 includes a crystal resonator 201 for signal generation and a loop filter 202 that are connected to the PLL circuit unit 200. The crystal resonator 201 for the signal generation is oscillated by the oscillator circuit inside the PLL circuit unit 200 and constitutes the VCXO together with this oscillator circuit. The PLL circuit unit 200 may include a frequency divider that divides a frequency signal obtained from the VCXO.

A frequency setting is performed for the DDS circuit unit of the PLL circuit unit 200 using a frequency setting value read out from the external memory 82 and stored in the register 7. In details, with respect to the PI calculation value output from the PI calculation unit 54, a frequency correction value is calculated by multiplying a coefficient in the primary correction unit 56, and the frequency correction value is added to the frequency setting value in an addition unit 58. Thus obtained frequency setting value after correction is input to the DDS circuit unit. Furthermore, with respect to the frequency setting value, a correction using, for example, a frequency correction value obtained from the temperature detection value ΔF, which is the output of the temperature detector 53, may be performed.

The DDS circuit unit uses the frequency signal f1 output from the first oscillator circuit 1 as an operation clock, reads out amplitude data from a waveform table (not illustrated), and generates the reference frequency signal in digital that corresponds to the frequency setting value after the correction. From this view point, the first crystal resonator 10 can be said to be a reference crystal resonator to obtain this reference frequency signal.

Meanwhile, the frequency signal in digital obtained by oscillating the crystal resonator 201 of the VCXO is divided as necessary, and subsequently, the phase of the frequency signal is compared with the phase of the reference frequency signal in the phase comparison unit. A signal corresponding to the phase difference is converted into analog in the charge pump unit, and input to the loop filter 202. In the loop filter 202, the phase difference converted into analog is integrated to be a control voltage of the crystal resonator 201. Here, the frequency signal obtained from the VCXO may be phase-compared with the reference frequency signal without changing the obtained frequency, or may be phase-compared with the reference frequency signal after dividing or multiplying the obtained frequency as necessary. The crystal resonator 201 of the VCXO corresponds to the crystal resonator for the signal generation.

With the configuration described above, a frequency control is executed such that the frequency of the frequency signal obtained by oscillating the crystal resonator 201 approaches the frequency of the reference frequency signal generated in the DDS circuit unit, and the frequency signal with the frequency that is stable is output from the VCXO. The frequency signal of the VCXO is output from the oscillator 1A after being divided as necessary in the frequency divider 203.

As described above, the oscillator 1A as the OCXO is also constituted as a TCXO (Temperature Compensated Xtal Oscillator) that corrects the frequency setting value based on a temperature detection result. In the oscillator 1A, double stabilizing measures for the frequency is taken. The double stabilizing measures for the frequency is by an effect of the heater circuit 50 and the frequency correction based on the temperature detection value ΔF (the PI calculation value that is calculated by integrating the difference value between the temperature setting value and the temperature detection value ΔF in the above-described example). Therefore, the frequency can be stabilized with high accuracy.

A description will be given of an assemble structure of the oscillator 1A including the above-described electrical configuration with reference to FIG. 2 to FIG. 4A and FIG. 4B.

Figure 2:
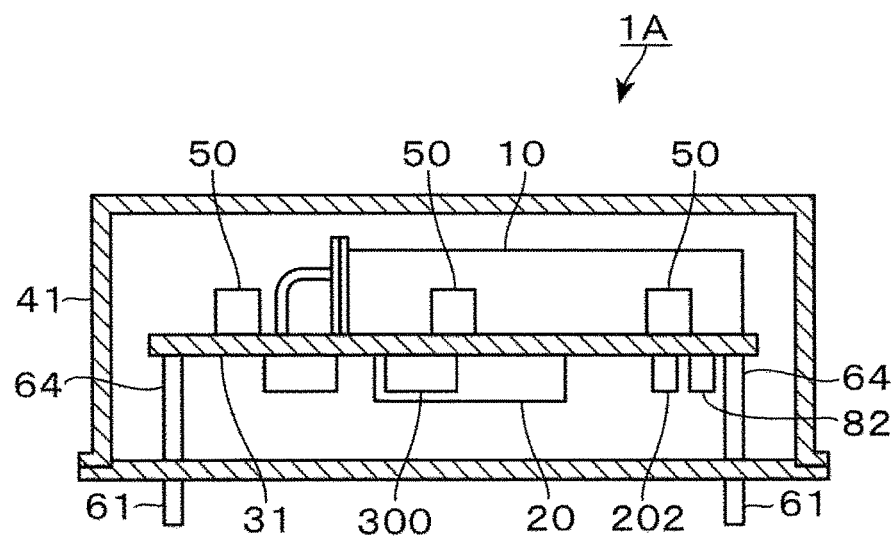
FIG. 2 is a longitudinal sectional side view of the oscillator.
Figure 3A:
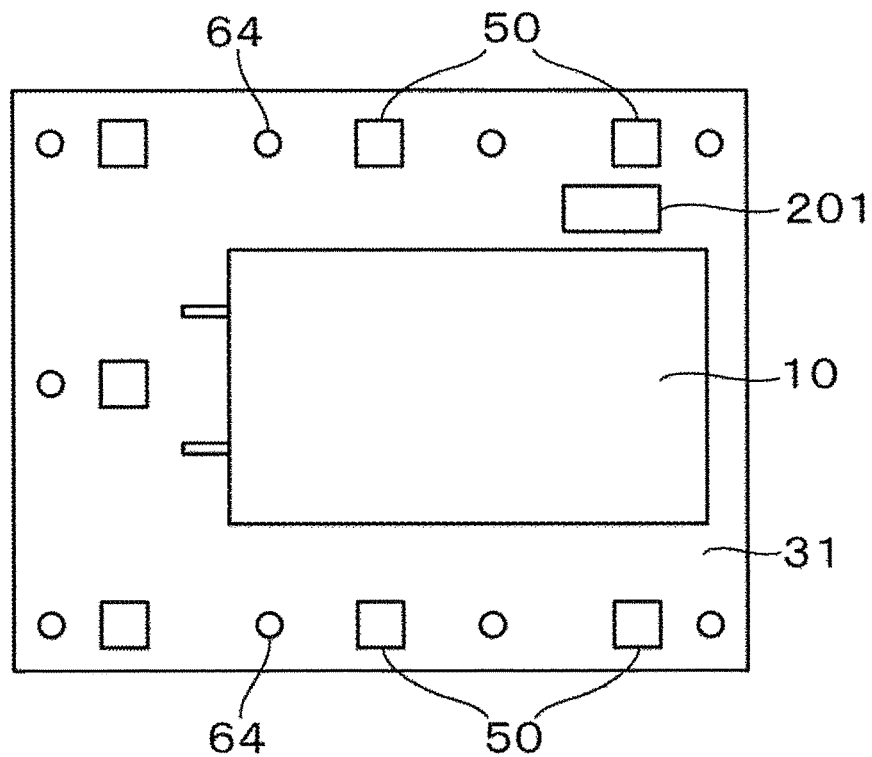
FIG. 3A and FIG. 3B are plan views of a base plate disposed in the oscillator.
Figure 3B:
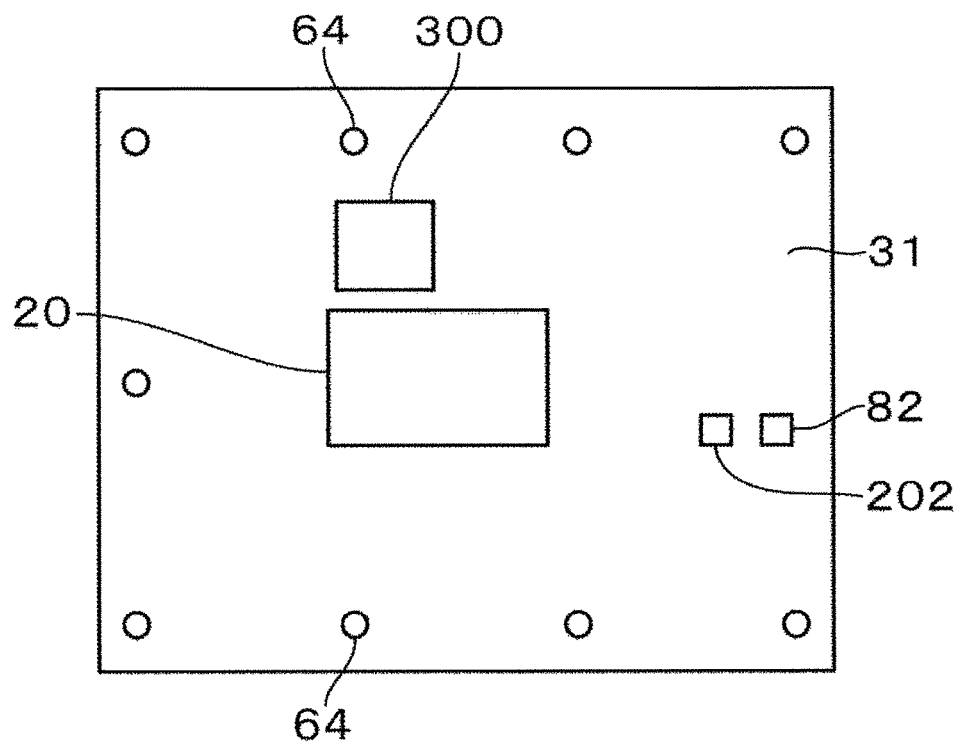

FIG. 2 is a longitudinal sectional side view of the whole oscillator 1A. FIG. 3A and FIG. 3B are plan views viewing a base plate 31 disposed inside the oscillator 1A from an upper surface side and a lower surface side, respectively. The following describes a three-dimensional configuration of the oscillator 1A using these drawings.

For example, the oscillator 1A has a configuration in which each of electronic components, such as each of the crystal resonators 10, 20, and 201, the LSI 300, and the external memory 82, which are described above, is separately disposed on the upper surface side and the lower surface side of the base plate 31. As illustrated in FIG. 2 and FIG. 3A and FIG. 3B, on the upper surface side of the base plate 31, the first crystal resonator 10, the crystal resonator 201 of the VCXO side, and a plurality of the heater circuits 50 are disposed. Meanwhile, on the lower surface side of the base plate 31, the second crystal resonator 20, the LSI 300, the external memory 82, and the loop filter 202 are disposed.

Figure 4A:
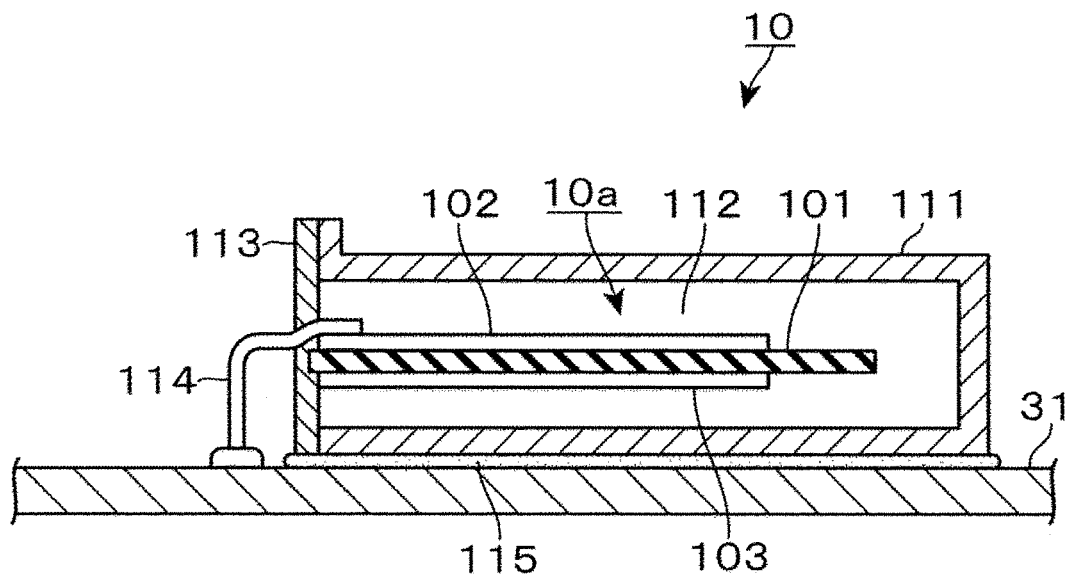
Figure 4B:
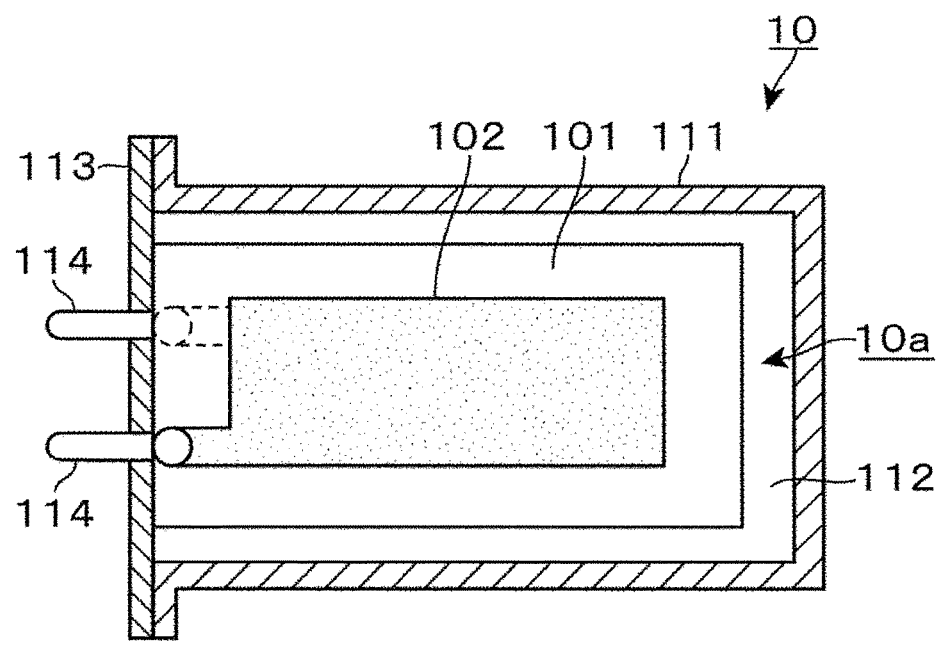

Each of the crystal resonators 10, 20, and 201 illustrated in FIG. 1 corresponds to quartz crystal pieces (for example, regarding the example of the first crystal resonator 10, a quartz crystal piece 10a in FIG. 4A and FIG. 4B) housed within a crystal resonator cover. However, for convenience of explanation, in FIG. 2 to FIG. 4A and FIG. 4B, whole electronic components including the respective crystal resonator covers and quartz crystal pieces are attached with reference numerals of the crystal resonators 10, 20, and 201.

Since the first and second crystal resonators 10 and 20 include approximately identical configurations, the configuration of the first crystal resonator 10 will be described with reference to FIG. 4A and FIG. 4B. FIG. 4A illustrates a longitudinal sectional side view and FIG. 4B illustrates a transverse plan view of the first crystal resonator 10.

The quartz crystal piece 10a of the first crystal resonator 10 has a thickness corresponding to the frequency of the frequency signal f1 output from the first oscillator circuit 1. The quartz crystal piece 10a of the first crystal resonator 10 is an energy trapping type crystal resonator in which, for example, excitation electrodes 102 and 103 in thin film shapes are disposed, so as to oppose to one another via this crystal element 101 on both the upper and lower sides of a crystal element 101 whose flat surface shape is rectangular.

One surface of a crystal resonator cover 111 that houses the quartz crystal piece 10a has an opening to insert the quartz crystal piece 10a. This opening is airtightly covered with a lid body 113. The crystal element 101 that constitutes the quartz crystal piece 10a has, for example, its one side secured to one surface of the lid body 113. Then, when the quartz crystal piece 10a is inserted in an internal space 112 of the crystal resonator cover 111 and the opening is covered with the lid body 113, the upper surface and the lower surface of the quartz crystal piece 10a on which the excitation electrodes 102 and 103 are formed are disposed between inner wall surfaces of the crystal resonator cover 111 via clearances. As a result of this, the surfaces on which the excitation electrodes 102 and 103 are disposed become free oscillation surfaces that are not restrained by other members.

The excitation electrodes 102 and 103 are electrically connected to a conductive connection pin 114 that passes through the lid body 113. Then, the other end side of the connection pin 114 that is extended to an outside from the internal space 112 surrounded by the crystal resonator cover 111 and the lid body 113 is connected to a wiring pattern (not illustrated) printed on the base plate 31. This electrically connects the quartz crystal piece 10a of the first crystal resonator 10 to the first oscillator circuit 1 inside the LSI 300. The connection pin 114, which passes through the lid body 113, is insulated from this lid body 113.

As described above, the first crystal resonator 10 for the purpose of detecting the temperature inside the container 41 and obtaining the frequency signal f1 used as the operation clock of the DDS circuit unit is constituted by using the crystal element 101 having a size larger than those of the other crystal resonators (the second crystal resonator 20 and the crystal resonator 201 of the VCXO side) in order to obtain the stable frequency signal with respect to changes in the ambient temperature and changes over time. In view of this, a size of the first crystal resonator 10 including the crystal resonator cover 111 is also the largest among the three crystal resonators 10, 20, and 201.

On the other hand, for the second crystal resonator 20, an energy trapping type crystal resonator approximately similar to the first crystal resonator 10 described using FIG. 4A and FIG. 4B is used. However, the frequency signal f2 is used only for the purpose of detecting the temperature inside the container 41, and the generation of the operation clock of the DDS circuit unit is not performed. In view of this, the second crystal resonator 20 requires less stable frequency with respect to the changes of the ambient temperature than that of the first crystal resonator 10. Therefore, from the aspect of downsizing of the oscillator 1A, in the example illustrated in FIG. 2 and FIG. 3A, the second crystal resonator 20 that has one side of the crystal element with a length approximately a half of that of the first crystal resonator 10 and the crystal resonator cover having a small size is employed.

Furthermore, for the crystal resonator 201 of the VCXO side, the phase of the frequency signal output from this VCXO is compared with the phase of the reference frequency signal in the PLL circuit unit 200, and the frequency adjustment is performed, so as to have this reference frequency signal matches the phase. Then, for the reference frequency signal, the stabilization of the frequency is made with high accuracy by the stabilization of the temperature inside the container 41 by the heater circuits 50 and the correction of the frequency setting value based on the temperature detection value ΔF.

Thus, regarding the frequency stability of the single crystal resonator 201 of the VCXO side that is frequency adjusted passively, the stability of the frequency with respect to the changes of the ambient temperature is not as required as the first crystal resonator 10 is. Therefore, this crystal resonator 201 prioritizes downsizing of the oscillator 1A, and a further small-sized crystal resonator is used with respect to the second crystal resonator 20. The quartz crystal piece of the crystal resonator 201 of the VCXO side may be the energy trapping type crystal resonator described using FIG. 4A and FIG. 4B or a SAW (Surface Acoustic Wave) crystal resonator constituted by forming an IDT (Inter Digital Transducer) on the surface of the crystal element.

Among each of the crystal resonators 10, 20, and 201 described above, the crystal resonator 10 and the crystal resonator 201 of the VCXO side are disposed on the upper surface side of the base plate 31.

In details, as illustrated in FIG. 3A, the first crystal resonator 10 is disposed in a position in a center portion in a short side direction and toward one end side in a longitudinal direction of the base plate 31. The crystal resonator 201 of the VCXO side having the smallest dimensions is disposed neighboring the first crystal resonator 10 such that directions of the long sides of one another are aligned.

On the upper surface side of the base plate 31 near a region where these crystal resonators 10 and 201 are disposed, the plurality of heater circuits 50 are disposed along each side of the base plate 31. In the example illustrated in FIG. 3A, seven heater circuits 50 are disposed having intervals with one another along three sides that are not occupied by the first crystal resonator 10. Each of the crystal resonators 10 and 201 and the heater circuits 50 are soldered onto the base plate 31 by, for example, a reflow method.

On the other hand, the second crystal resonator 20, which is left undescribed, is disposed in a center on the lower surface side of the base plate 31. The LSI 300 is disposed neighboring this second crystal resonator 20. Furthermore, on the lower surface side of the base plate 31, the external memory 82 and the loop filter 202 are disposed. These second crystal resonator 20, LSI 300, and similar part are also soldered onto the base plate 31 by, for example, the reflow method.

The base plate 31 on which the above-mentioned various kinds of electronic components are disposed is disposed in a state of being housed within, for example, the container 41 made of metal and floating in an internal space of the container 41 with conductive support pins 64. The support pins 64 are electrically connected to the electronic components disposed on the base plate 31. A lower surface of the container 41 includes conductive connection pins 61 to connect the oscillator 1A to a device in which the oscillator 1A is incorporated. The connection pins 61 are electrically connected to the support pins 64 that support the base plate 31 and insulated from the container 41.

Since an inside of the container 41 is adjusted at a constant temperature by the heater circuits 50, the oscillator 1A having the above-described configuration has a capability of suppressing the change of the temperature of the atmosphere where each of the crystal resonators 10, 20, and 201 is placed and outputting the frequency signal with the frequency that is stable.

However, when the oscillator 1A in which an advanced frequency stabilizing measures is taken was actually manufactured, there has been a confirmed case where the frequency of the frequency signal that was output from the oscillator 1A was varied exceeding a frequency range corresponding to a temperature adjustment range of the heater circuit 50.

Therefore, the inventor performed an examination regarding a cause of such frequency variation. For example, the above-described heater circuit 50 can adjust the temperature inside the container 41 so as to fall within a control width of 20 millidegree Celsius. At this time, for example, using the crystal element 101 in an SC-cut, the output of the heater circuit 50 is adjusted such that the temperature setting values of the respective crystal resonators 10 and 20 match a zero-temperature coefficient point (ZTC point: Zero-Temperature Coefficient, a temperature at which the frequency change caused by the temperature change of the crystal resonator becomes the minimum) of the SC-cut crystal. This can suppress a theoretical frequency variation at ±0.1 ppb or less.

Figure 5:
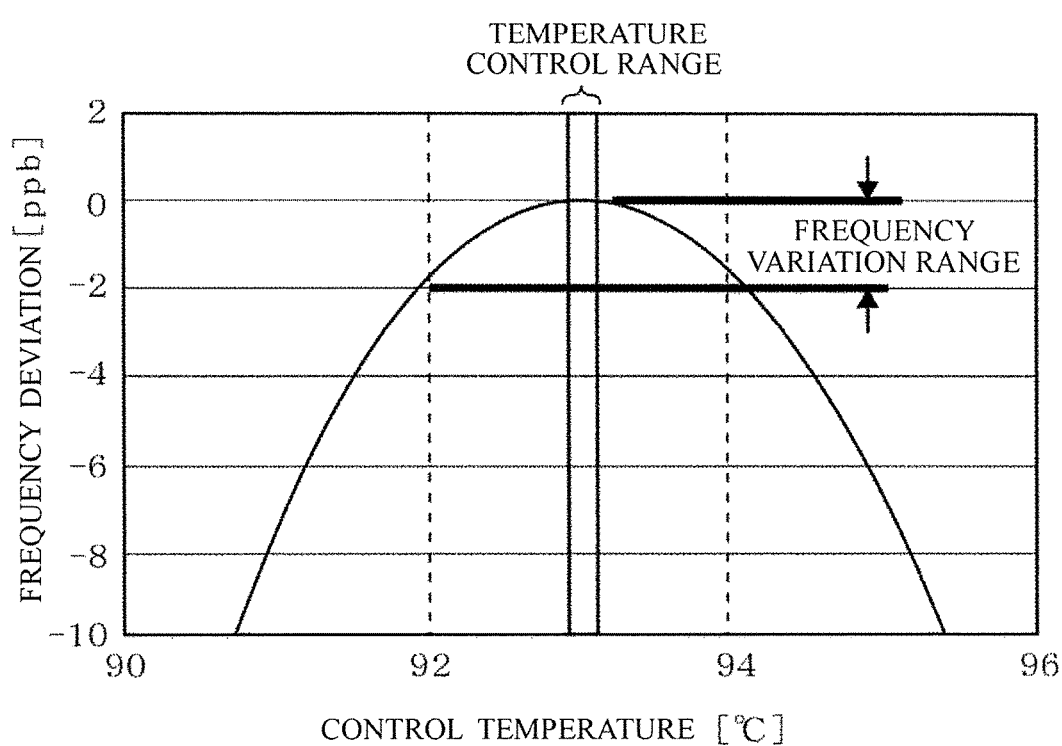
FIG. 5 is a characteristic diagram showing a general frequency/temperature characteristic of a crystal resonator.

For example, FIG. 5 shows frequency/temperature characteristic of the SC-cut crystal. A temperature range indicated by a solid line indicates an approximate temperature control range by the heater circuit 50.

However, the actual frequency variation width was approximately ±2 ppb to ±7 ppb. As the temperature range is indicated by a dashed line in FIG. 5, a large frequency variation corresponding to the temperature variation of ±2° C. or more was observed. As shown in comparative examples described below (FIG. 8), the frequency/temperature characteristic of the oscillator 1A when the ambient temperature is changed shows a positive primary straight line and shows a behavior different from the frequency/temperature characteristic of the SC-cut crystal shown in FIG. 5 (see FIG. 8).

Then, the inventor performed a further examination regarding elements that affect the frequency/temperature characteristic of the oscillator 1A except for the temperature control by the heater circuit 50. As a result, it was found that a selection of a material for the crystal resonator cover 111 (including the lid body 113, and the same applies hereinafter), which houses the quartz crystal piece 10a of the first crystal resonator 10, largely affects the frequency/temperature characteristic of the oscillator 1A.

As described above, the first crystal resonator 10, which is used for the temperature detection inside the container 41 and oscillation of the operation clock of the DDS circuit unit, most largely affects the stability of the frequency of the frequency signal output from the oscillator 1A by the ambient temperature change. In view of this, the temperature of the internal space 112 in the crystal resonator cover 111 in which the quartz crystal piece 10a is placed also needs to be adjusted with high accuracy. The quartz crystal piece 10a of the first crystal resonator 10 is large in size compared with the quartz crystal pieces of the other crystal resonators 20 and 201, therefore, the whole quartz crystal piece 10a needs to be uniformly heated.

Therefore, in the oscillator 1A before improvement, for the crystal resonator cover 111 that houses the quartz crystal piece 10a, it has been employed oxygen free copper (heat conductivity of approximately 390 W/m·K) that has a high heat conductivity among copper that is satisfactory in heat conductivity and has no possibility of hydrogen embrittlement.

Meanwhile, as illustrated in FIG. 4A and FIG. 4B, the crystal resonator cover 111 has its lower surface side secured to the base plate 31 with a solder 115. When this crystal resonator cover 111 is soldered to the base plate 31, in the case of the reflow method, the crystal resonator cover 111 is heated up to approximately 270° C. in a range of 220° C. to 270° C. However, an annealing temperature of the oxygen free copper is approximately 200° C., and the annealing occurs during the soldering. Therefore, the crystal resonator cover 111 is softened.

In the case where softening of the crystal resonator cover 111 occurs, there possibly is a change in the frequency of the frequency signal f1 due to a distortion generated in the quartz crystal piece 10a by an effect of temperature distribution formed in the crystal resonator cover 111. It is inferred that a distortion of the crystal resonator cover 111 itself changes a capacity component formed between the quartz crystal piece 10a and the crystal resonator cover 111, and this changes the frequency of the f1. It is considered that, such frequency signal f1 is used for the temperature detection inside the container 41 or the frequency signal f1 is used as the operation clock, the frequency of the reference frequency signal output from the DDS circuit unit is changed, and the frequency of the frequency signal output from the oscillator 1A is further changed.

Then, in the oscillator 1A of the present invention, as the material constituting the crystal resonator cover 111 of the first crystal resonator 10, phosphorus deoxidized copper is selected. The phosphorus deoxidized copper has a high annealing temperature compared with the oxygen free copper (approximately 300° C.). While having a low heat conductivity compared with the oxygen free copper (approximately 340 W/m·K), the phosphorus deoxidized copper has no possibility of the hydrogen embrittlement. The phosphorus deoxidized copper is a material satisfactory in heat conductivity compared with nickel silver (annealing temperature of approximately 600° C. to 800° C. and heat conductivity of approximately 30 W/m·K to 40 W/m·K) and phosphor bronze (annealing temperature of approximately 500° C. to 700° C. and heat conductivity of approximately 70 W/m·K to 80 W/m·K). In view of this, while an action of the temperature adjustment by the heater circuit 50 is hardly reduced, an effect of softening of the crystal resonator cover 111 can be lowered.

Figure 6:
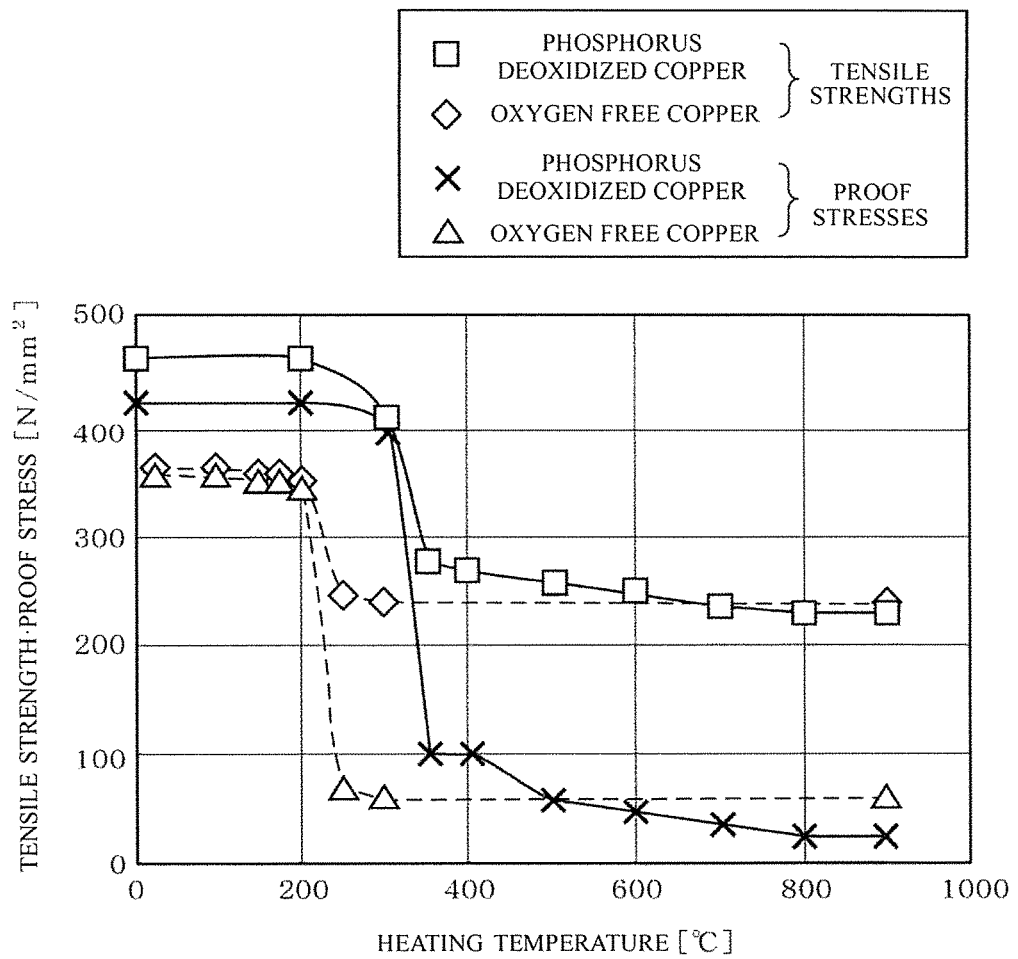
FIG. 6 is a first explanatory drawing showing mechanical characteristic changes of crystal resonator cover materials with respect to heating temperature.
Figure 7:
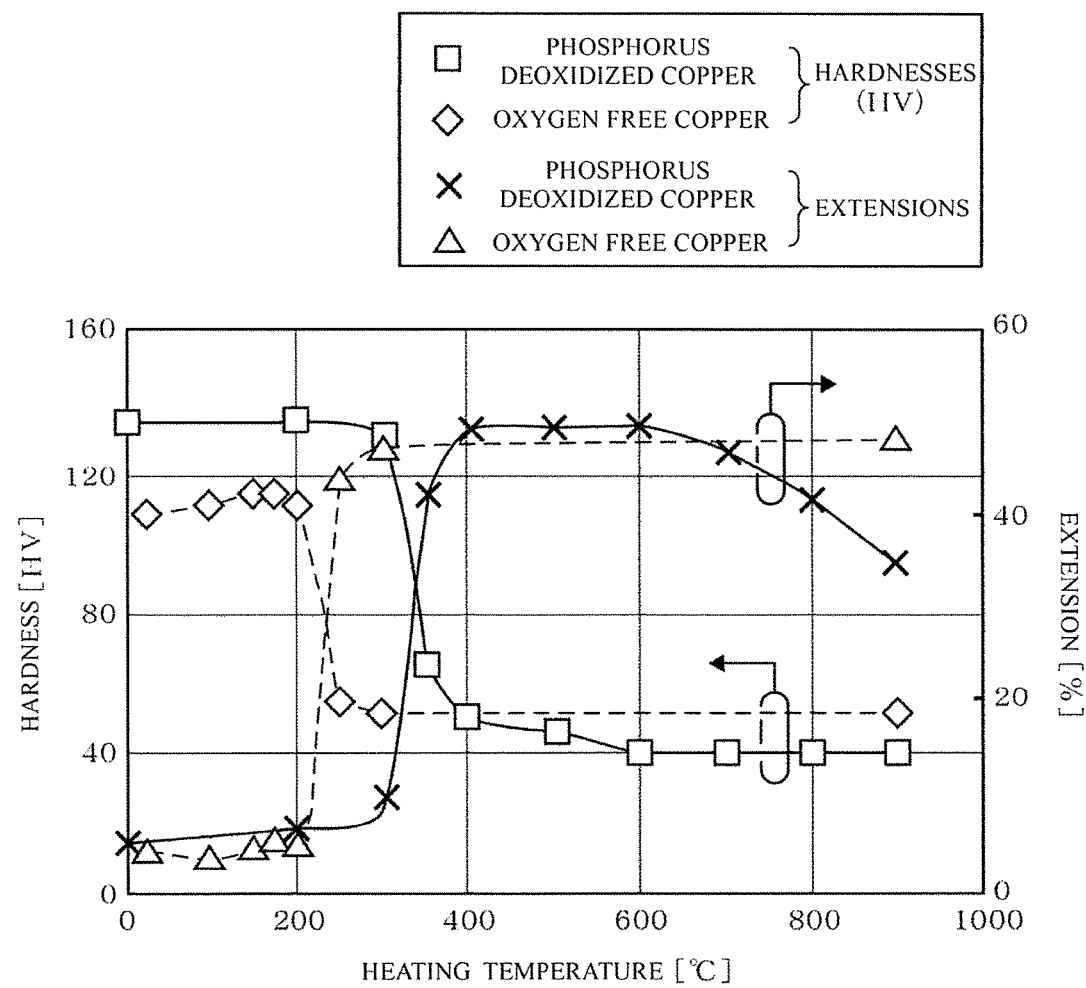
FIG. 7 is a second explanatory drawing showing mechanical characteristic changes of the crystal resonator cover materials with respect to the heating temperature.

Here, for example, FIG. 6 shows (1) tensile strengths: when tensile tests were performed to respective specimens of the phosphorus deoxidized copper or the oxygen free copper that were heat processed, forces applied to the specimens when the specimens broke, and (2) proof stresses: by tests similar to the tensile test, forces applied to the specimens when extensions of the specimens were at 0.2%, of the phosphorus deoxidized copper and the oxygen free copper. FIG. 7 shows (3) Vickers hardnesses: results of measuring Vickers hardnesses of the respective specimens of the phosphorus deoxidized copper or the oxygen free copper that are heat processed, and (4) extensions: extensions when the specimens used in the tensile tests (1) broke, of the phosphorus deoxidized copper and the oxygen free copper.

A source of each data is: regarding the phosphorus deoxidized copper, "data written in a paragraph of '2512 softening curves' in JIS H0500 (Glossary of terms used in wrought copper)"; and regarding the oxygen free copper, "Material C1020-H, Annealing softening characteristics, Characteristic test data of plate shaped material of wrought copper, Homepage of Japan Copper and Brass Association."

Horizontal axes in FIG. 6 and FIG. 7 indicate heating temperatures of the specimens. FIG. 6 shows the tensile strengths and the proof stresses [N/mm$^2$]. The tensile strength of the phosphorus deoxidized copper is plotted with an outlined square, and the tensile strength of the oxygen free copper is plotted with an outlined diamond. The proof stress of the phosphorus deoxidized copper is plotted with a cross mark, and the proof stress of the oxygen free copper is plotted with an outlined triangle. Meanwhile, FIG. 7 shows the Vickers hardnesses [HV] and the extensions [%] of the specimens. In FIG. 7, a vertical axis on the left side indicates the Vickers hardness. The phosphorus deoxidized copper is plotted with the outlined square, and the oxygen free copper is plotted with the outlined diamond. A vertical axis on the right side in FIG. 7 indicates the extension of the specimens. The phosphorus deoxidized copper is plotted with the cross mark, and the oxygen free copper is plotted with the outlined triangle. Here, in obtaining temperatures at which the annealings occur, it is only necessary to confirm change states of each data with respect to the heating temperature. In view of this, for a reason of a display range of the vertical axis, the data for the extension of the phosphorus deoxidized copper (cross mark) in FIG. 7 is plotted with a value of one tenth of the test data.

From the results shown in FIG. 6 and FIG. 7, it is seen that the oxygen free copper has rapidly lowered tensile strength, proof stress, and Vickers hardness after the heating temperature exceeds 200° C., and the annealing occurs at a temperature of 220° C. to 270° C. at which the first crystal resonator 10 is soldered. Meanwhile, the phosphorus deoxidized copper does not have lowered tensile strength, proof stress, and Vickers hardness until the heating temperature reach close to 300° C., and an occurrence of the annealing is not seen in the range of the above-described soldering temperature.

Based on the above-mentioned examination, selecting the phosphorus deoxidized copper as the material of the crystal resonator cover 111 that houses the quartz crystal piece 10a of the first crystal resonator 10 could improve a frequency deviation of the oscillator 1A to an accuracy of ±1.7 ppb or less when the ambient temperature is changed as described in the following working examples.

Meanwhile, compared with the first crystal resonator 10, for the crystal resonator cover that houses the quartz crystal piece of the second crystal resonator 20 or the crystal resonator 201 of the VCXO side, which has relatively low effect on the frequency stability, the oxygen free copper whose annealing temperature is lower than the phosphorus deoxidized copper may be used or an iron-based material whose annealing temperature is higher than the phosphorus deoxidized copper may be used. For example, when the container 41 is made of ceramic, using the crystal resonator cover having a heat expansion rate similar to the ceramic, such as alloy 42 (iron-based alloy with 42% of nickel and 57% of iron, annealing temperature: approximately 800° C. or more) can prevent a breakage of the container 41 caused by effects of expansions of a bonded portion between the base plate 31 and the crystal resonator cover, and the crystal resonator cover being transmitted to the container 41 via the base plate 31 and the support pins 64.

Here, in the above-described description using FIG. 2 to FIG. 4A and FIG. 4B, the quartz crystal piece 10a and the crystal resonator cover 111 are collectively referred to as "the first crystal resonator 10" for convenience. Meanwhile, to clarify the correspondence relationship between a designation in invention-specifying matters written in Claims and a designation in Description, "the quartz crystal piece 10a" corresponds to the crystal resonator. The crystal resonator cover 111 houses this crystal resonator (the quartz crystal piece 10a) and secured to the base plate 31 by soldering.

With the oscillator 1A according to the embodiment, the following effects are provided. As the crystal resonator cover 111 of the quartz crystal piece 10a (the crystal resonator) disposed in the oscillator 1A including the heater circuits 50, the phosphorus deoxidized copper that is high in heat conductivity and high in the annealing temperature is used. As a result, while keeping a state in which the temperature control of the quartz crystal piece 10a by the heater circuits 50 is easily performed, the generation of distortion, which is caused when the crystal resonator cover 111 is soldered onto the base plate 31, is suppressed, thereby ensuring lowering the effect that the distortion has on the frequency variation of the frequency signal.

Here, it is not required to use the first crystal resonator 10 for the temperature detection inside the container 41. For example, the temperature detection may be performed using a thermocouple and a thermistor, and the outputs of the heater circuits 50 may be adjusted based on the temperature detection result by these elements. In this case, the first crystal resonator 10 is only used for obtaining the reference frequency signal, and the second crystal resonator 20 is not disposed.

It is also not a necessary requirement to use the frequency signal f1, which is obtained using the first crystal resonator 10, as the operation clock of the DDS circuit unit. For example, the frequency signal f1 may be used as the reference frequency signal and the phase comparison with the frequency signal that is obtained from the VCXO may be performed.

WORKING EXAMPLES (Temperature Frequency Characteristic Experiment)

The phosphorus deoxidized copper or the oxygen free copper was employed as the material of the crystal resonator cover 111 of the first crystal resonator 10, and the frequency/temperature characteristic of the oscillator 1A was measured.

A. Experimental Condition

Working Example 1 to Working Example 3

The phosphorus deoxidized copper was used as the material of the crystal resonator cover 111 of the first crystal resonator 10, and the crystal resonator cover 111 was secured to the base plate 31 by soldering by the reflow method where the highest temperature reaches 270° C. Three oscillators 1A having the configuration described using FIG. 2 to FIG. 4 A and FIG. 4B were manufactured by this method. Then, the temperature characteristics of the frequencies of the frequency signals output from the respective oscillators 1A were measured while the ambient temperature was changed in a range of −40° C. to +85° C. The crystal element 101 in a Modified SC (M-SC) cut is used for the quartz crystal piece 10a of the first crystal resonator 10. The temperature control was performed by the heater circuits 50 such that the temperature setting values of the first and second crystal resonators 10 and 20 become 93° C. A frequency setting value of the oscillator 1A is 10 MHz.

Comparative Example 1 to Comparative Example 3

Three oscillators 1A were manufactured by a method similar to Working Example 1 to Working Example 3 except that the material of the crystal resonator cover 111 was the oxygen free copper. Then, the temperature characteristics of the frequencies of the frequency signals output from the oscillators 1A were measured.

B. Experimental Results

Figure 8:
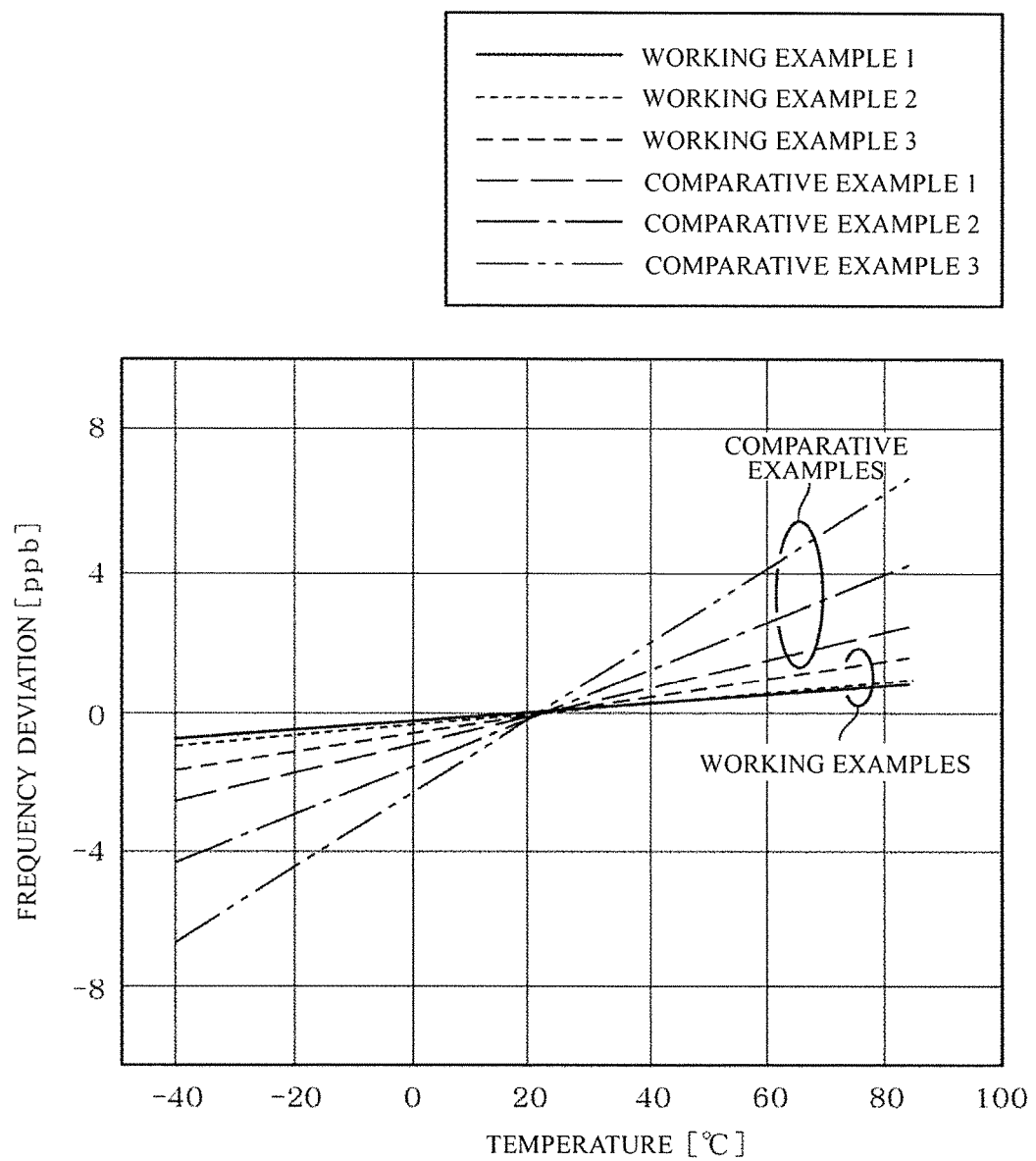
FIG. 8 is an explanatory drawing showing frequency/temperature characteristics of oscillators according to working examples and comparative examples.

Results of Working Example 1 to Working Example 3 and Comparative Example 1 to Comparative Example 3 are shown in FIG. 8. In FIG. 8, a horizontal axis indicates the ambient temperature [° C.] of the oscillator 1A and a vertical axis indicates the frequency deviation ((frequency setting value−output frequency)/frequency setting value) [ppb] of the frequency signal output from the oscillator 1A with respect to the frequency setting value. In the drawing, Working Example 1 is indicated by a solid line, Working Example 2 is indicated by a dotted line, and Working Example 3 is indicated by a short dashed line, and Comparative Example 1 is indicated by a long dashed line, Comparative Example 2 is indicated by a dash-dotted line, and Comparative Example 3 is indicated by a two-dot chain line.

From the results shown in FIG. 8, in Working Example 1 to Working Example 3, when the ambient temperatures of the respective oscillator 1A were at the lowest (−40° C.) or the highest (+85° C.), frequency deviations were within a range of ±1.7 [ppb] or less. In contrast to this, in Comparative Example 1 to Comparative Example 3, similar frequency deviations increased up to a range of ±2.0 to ±7.0 [ppb].

From these results, it was confirmed that the stability of the frequency of the frequency signal output from the oscillator 1A is improved with respect to the ambient temperature change by selecting the phosphorus deoxidized copper as the material of the crystal resonator cover 111 of the first crystal resonator 10.

The invention claimed is:

1. An oscillator, including a crystal resonator disposed on a base plate inside a container, and the oscillator outputting a frequency signal with a frequency preliminarily set, the oscillator comprising:
a crystal resonator cover, housing the crystal resonator, and the crystal resonator cover being secured to the base plate by soldering;
an oscillator circuit, connected to the crystal resonator;
a temperature detector, detecting a temperature inside the container; and
a heater circuit, increasing or decreasing an output based on the temperature detected by the temperature detector to adjust the temperature inside the container, wherein
the crystal resonator cover is constituted of a phosphorus deoxidized copper.

2. The oscillator according to claim 1, wherein
the crystal resonator cover is soldered onto the base plate at a temperature in a temperature range of 220° C. to 270° C.

3. The oscillator according to claim 1, wherein
the heater circuit is installed on the base plate.

4. The oscillator according to claim 1, further comprising:
a voltage control oscillating unit that includes a crystal resonator for a signal generation to output a frequency signal with a frequency corresponding to a control voltage, and the voltage control oscillating unit constituting a PLL circuit, wherein
the crystal resonator is a reference crystal resonator to obtain a reference frequency signal whose phase is compared with a phase of the frequency signal obtained from the voltage control oscillating unit, and
the crystal resonator for the signal generation is housed in a crystal resonator cover constituted of a metal having an annealing temperature lower than that of the phosphorus deoxidized copper and the crystal resonator cover is secured to the base plate by soldering.

5. The oscillator according to claim 1, further comprising
a second crystal resonator that is different from a first crystal resonator when assuming that the crystal resonator is the first crystal resonator, wherein
the temperature detector detects a temperature inside the container based on a value corresponding to a frequency difference between an oscillation frequency of the first crystal resonator and an oscillation frequency of the second crystal resonator, and
the second crystal resonator is housed in a crystal resonator cover constituted of a metal having an annealing temperature lower than that of the phosphorus deoxidized copper and the crystal resonator cover with the low annealing temperature is secured to the base plate by soldering.

* * * * *